(12) United States Patent
Ibori et al.

(10) Patent No.: US 8,848,384 B2
(45) Date of Patent: Sep. 30, 2014

(54) POWER TRANSDUCER

(71) Applicant: Hitachi Industrial Equipment Systems Co., Ltd., Tokyo (JP)

(72) Inventors: Satoshi Ibori, Yachimata (JP); Yasushi Sasaki, Yotsukaido (JP); Yutaka Maeno, Yotsukaido (JP); Masayuki Hirota, Narashino (JP); Kazuyuki Fukushima, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 0 days.

(21) Appl. No.: 13/713,621

(22) Filed: Dec. 13, 2012

(65) Prior Publication Data

US 2013/0100632 A1    Apr. 25, 2013

Related U.S. Application Data

(63) Continuation of application No. 12/537,281, filed on Aug. 7, 2009, now Pat. No. 8,385,078.

(30) Foreign Application Priority Data

Sep. 29, 2008 (JP) .................................. 2008-249512
Mar. 24, 2009 (JP) .................................. 2009-071138

(51) Int. Cl.
| | | |
|---|---|---|
| H05K 7/00 | (2006.01) | |
| H02M 7/00 | (2006.01) | |
| H05K 7/02 | (2006.01) | |
| H05K 7/14 | (2006.01) | |
| H05K 1/14 | (2006.01) | |
| H05K 1/02 | (2006.01) | |
| H05K 3/34 | (2006.01) | |

(52) U.S. Cl.
CPC ................. *H05K 7/02* (2013.01); *H02M 7/003* (2013.01); *H05K 2201/10015* (2013.01); *H05K 1/0256* (2013.01); *H05K 2201/10166* (2013.01); *H05K 7/1432* (2013.01); *H05K 1/141* (2013.01); *H05K 3/3447* (2013.01)
USPC ............................................ 361/760; 361/820

(58) Field of Classification Search
None
See application file for complete search history.

(56) References Cited

U.S. PATENT DOCUMENTS

| | | | |
|---|---|---|---|
| 5,424,915 A | | 6/1995 | Katooka et al. |
| 5,519,252 A | * | 5/1996 | Soyano et al. ................ 257/690 |

(Continued)

FOREIGN PATENT DOCUMENTS

| | | |
|---|---|---|
| JP | 2-84269 U | 6/1990 |
| JP | 2003-324971 A | 11/2003 |

(Continued)

*Primary Examiner* — Hoa C Nguyen
*Assistant Examiner* — Xanthia C Cunningham
(74) *Attorney, Agent, or Firm* — Mattingly & Malur, PC (57) ABSTRACT

A power transducer is downsized by reducing the size of a power source board and highly reliable. The power source board is provided in the power transducer and for a large-current circuit. The power transducer includes a power semiconductor module having lead terminals. Of the lead terminals provided for the power semiconductor module and connected with the main circuit board, predetermined one or ones of the lead terminals is or are connected with the main circuit board in the vicinity of a main circuit terminal stage and at a position or positions lower than the main circuit terminal stage. Alternatively, predetermined one or ones of the lead terminals is or are connected with the main circuit board at a position or positions lower than a position at which the main circuit terminal stage is provided.

8 Claims, 6 Drawing Sheets

(56) References Cited

U.S. PATENT DOCUMENTS

| | | | |
|---|---|---|---|
| 5,610,799 | A | 3/1997 | Kato |
| 5,657,203 | A | 8/1997 | Hirao et al. |
| 6,091,604 | A * | 7/2000 | Plougsgaard et al. ........ 361/707 |
| 6,201,701 | B1 | 3/2001 | Linden et al. |
| 6,330,165 | B1 | 12/2001 | Kohjiro et al. |
| 6,521,983 | B1 * | 2/2003 | Yoshimatsu et al. .......... 257/678 |
| 6,583,355 | B2 * | 6/2003 | Skrzypchak .................. 174/521 |
| 6,690,582 | B2 * | 2/2004 | Sumida ......................... 361/752 |
| 6,958,535 | B2 * | 10/2005 | Hirano et al. ................. 257/707 |
| 6,995,461 | B2 * | 2/2006 | Soyano et al. ................ 257/678 |
| 7,208,833 | B2 * | 4/2007 | Nobori et al. ................. 257/704 |
| 7,209,367 | B2 | 4/2007 | Nakano et al. |
| 7,706,146 | B2 * | 4/2010 | Lee et al. ..................... 361/752 |
| 8,054,641 | B2 | 11/2011 | Onishi et al. |
| 8,258,622 | B2 * | 9/2012 | Lee et al. ..................... 257/727 |
| 2006/0082983 | A1 * | 4/2006 | Parkhill et al. ................ 361/775 |
| 2006/0152907 | A1 * | 7/2006 | Rathmann .................... 361/720 |
| 2006/0286827 | A1 | 12/2006 | Lai |
| 2007/0133180 | A1 | 6/2007 | Nilson et al. |
| 2007/0139896 | A1 | 6/2007 | Yamada et al. |
| 2008/0262750 | A1 | 10/2008 | Ibori et al. |
| 2009/0213553 | A1 * | 8/2009 | Tschirbs et al. .............. 361/709 |

FOREIGN PATENT DOCUMENTS

| | | |
|---|---|---|
| JP | 2003-332526 A | 11/2003 |
| JP | 2006-236852 A | 9/2006 |

* cited by examiner

LINT WITH MOISTURE
ABSORBED THEREIN

POWER TRANSDUCER

This application is a continuation of U.S. patent application Ser. No. 12/537,281, filed Aug. 7, 2009.

BACKGROUND OF THE INVENTION (1) Field of the Invention

The present invention relates to a power transducer and more particularly to an internal structure thereof.

(2) Description of the Related Art

An inverter, which is a form of power transducers, is frequently used as a device that controls a speed of an industrial alternating current motor. For example, a power transducer is implemented in home electric appliances, vehicles or the like. In addition to the mounting to home electric appliances and vehicles, a power transducer may be mounted on a control board. In such cases, spaces where the power transducers are to be mounted are restricted in general. Thus it is strongly requested to reduce the size of the power transducers.

A typical one of the power transducers drives a power element (power semiconductor device) such as an insulated gate bipolar transistor (IGBT) as a switching element to variably control voltages and frequencies. In recent years, a semiconductor module having incorporated therein a peripheral circuit such as a protective circuit has often been used to reduce the size of the power transducer. Such a semiconductor module is so-called an intelligent power module (IPM).

JP-A-2003-332526 discloses a power module in order to reduce the size of a power transducer. As described in paragraphs 0014 and 0015 of JP-A-2003-332526, a wiring board for the power transducer is divided into a power source board (provided for a large-current circuit) and a control board (provided for a minute electric current circuit). In this case, only the control board is located in the vicinity of an upper surface of a main circuit module. FIG. 15 of JP-A-2003-332526 shows an example of the wiring board. With the thus divided wiring board, a thin copper foil printed wiring board can be used as the control board (wiring board provided for a control circuit) in which a current with a small amount flows. Thus, the size of the wiring board can be suppressed and thereby the area of a region in which to mount the power module is reduced.

SUMMARY OF THE INVENTION

In JP-A-2003-332526, although the thin copper foil printed wiring board is provided to suppress the size of the wiring board, it is not intended to reduce the size of a wiring pattern formed on the board. In the case where the wiring board for the power transducer is divided into the power source board (provided for the large-current circuit) and the control board (provided for the minute electric current circuit), a current as large as several tens of amperes may flow in the power source board. Therefore, the copper foil pattern needs to have a width and thickness enough to resist a current having a large amount. Since any other component cannot be mounted on the copper foil pattern, it is desirable to reduce a ratio of the area of the copper foil pattern to the area of the power source board for reduction in the size of the power source board or the power transducer.

When lead terminals of a power semiconductor module are connected with a power source board to reduce the size of a wiring pattern and thereby reduce the size of a power transducer, lint may be accumulated in a space between the lead terminals. The lead terminals may be short-circuited due to the lint thus accumulated depending on an environment in which the power transducer is installed. For example, in an environment in which textile machines are installed, lint flies in the air and it is humidified lest threads should be cut. Textile manufacturing work is always performed in such a humid environment.

If the power transducer is operated in the humid environment, then lint will be accumulated in a space between adjacent lead terminals of the power semiconductor module as described above. As a result, the lint absorbs moisture therein and thereby short-circuit may occur between the lead terminals, with the result that the power transducer disadvantageously will not normally operate.

An object of the present invention is to reduce the size of a power transducer, for example. Another object of the present invention is to prevent lead terminals from short-circuiting, and improve reliability of the power transducer, for example.

In order to accomplish the object, a transducer according to an aspect of the present invention includes: a main circuit board provided with a main circuit terminal stage, the main circuit board including a copper foil pattern having one end electrically connected to the main circuit terminal stage; and a power semiconductor provided with lead terminals for electrical connection to the main circuit terminal stage; wherein the main circuit board is formed with through holes such that the lead terminals extend through the through holes between the other end of the copper foil pattern and an end of the main circuit board at a side for input and output of wiring in the main circuit terminal stage.

According to the present invention, it is possible to reduce the size of a power transducer, for example. According to the present invention, it is possible to prevent lead terminals from short-circuiting, and improve reliability of the power transducer, for example.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Detail embodiments of the present invention are described with reference to FIGS. 1 to 9.

First Embodiment

A power transducer 100 according to the first embodiment of the present invention is described with reference to drawings.

Figure 1:
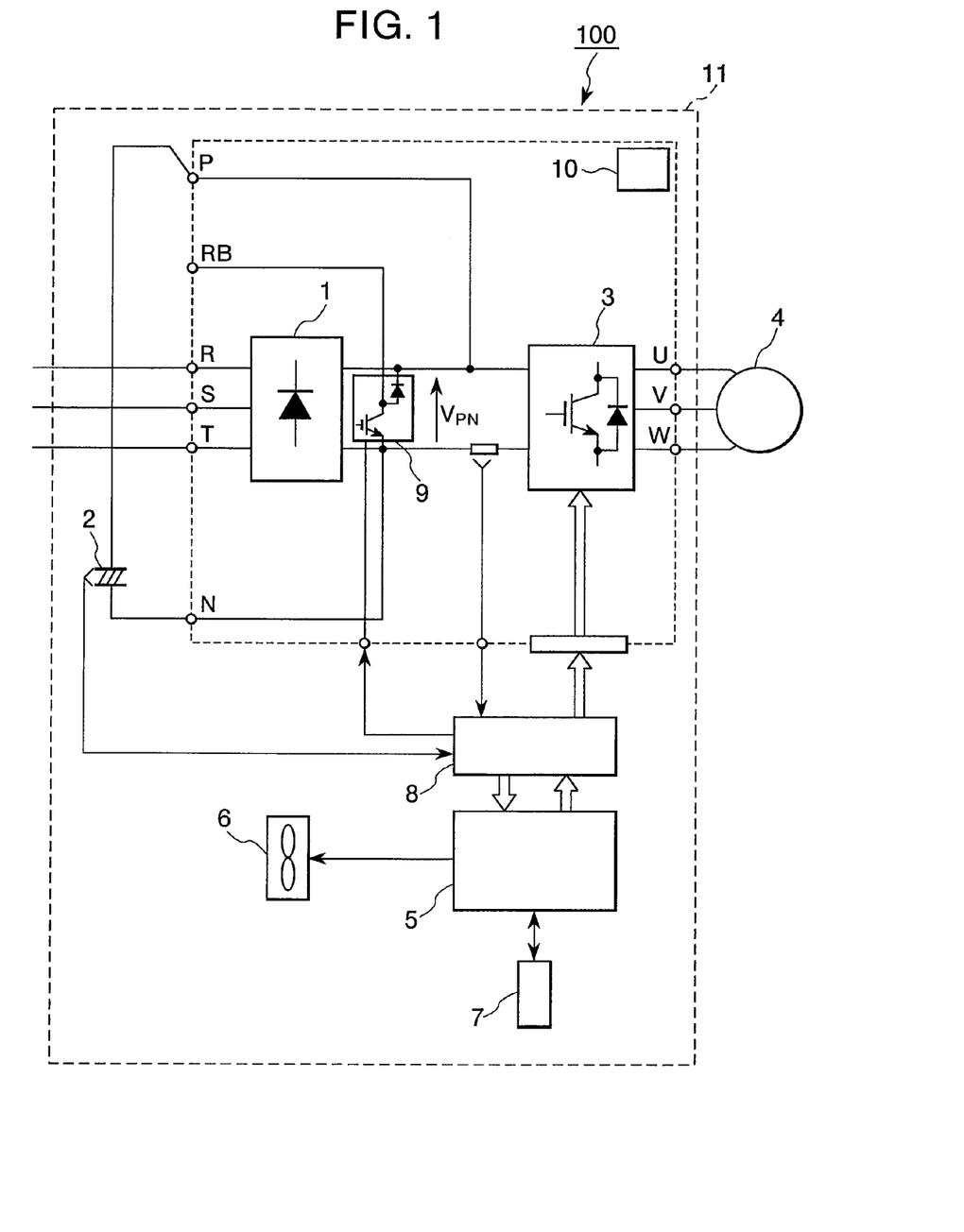
FIG. 1 is an outline diagram showing a main circuitry of a power transducer.

FIG. 1 is an outline diagram showing a circuitry of the power transducer 100 according to the first embodiment. The power transducer 100 according to the first embodiment includes a converter 1, a smoothing capacitor 2, an inverter 3 and an alternating current motor 4. The converter 1 converts alternating current power into direct current power. The smoothing capacitor 2 is provided in a direct current intermediate circuit. The inverter 3 converts direct current power into alternating current power having an arbitrary frequency. The alternating current motor 4 is controlled by the power transducer. The power transducer 100 according to the first embodiment further includes a cooling fan 6, a digital operation panel 7 and a power semiconductor module 10. The cooling fan 6 cools the power semiconductor module 10. The power semiconductor module 10 includes power semiconductor chips such as the converter 1 and the inverter 3. The digital operation panel 7 is used to set and change various data (control data) necessary for control of the power transducer. An abnormal condition of the power transducer and a monitored state of the power transducer are displayed on the digital operation panel 7.

The power transducer 100 further includes a control circuit 5 that controls each of switching elements such as the inverter 3. The control circuit 5 serves to control the entire power transducer and includes a microcomputer (control calculator). The internal configuration of the microcomputer is not shown. The microcomputer performs a calculation based on data stored in a storage section storing the various control data. The various control data is input to the control circuit 5 by means of the digital operation panel 7. The control circuit 5 receives the various digital data and performs necessary control processing in response to the received digital data. An abnormal condition of the power transducer is displayed on the digital operation panel 7 when the abnormal condition occurs.

The power transducer 100 further includes a driver circuit 8 that drives each of the switching elements such as the inverter 3 in response to an instruction received from the control circuit 5. The driver circuit 8 includes a switching regulator (DC/DC converter). The switching regulator generates direct voltages necessary for an operation of the power transducer 100 and supplies the generated voltages to the respective elements.

The power transducer 100 further includes a regenerative braking circuit 9. The regenerative braking circuit 9 consumes energy regenerated when the alternating current motor 4 is decelerated. The power semiconductor module 10 includes an insulated gate bipolar transistor (IGBT) that is a typical switching element. The switching element is not limited to the IGBT. The switching element included in the power semiconductor module 10 may be any element as long as the element serves as a switching element. The inverter that is a form of power transducers is a known technique, and not described in detail.

Figure 2:
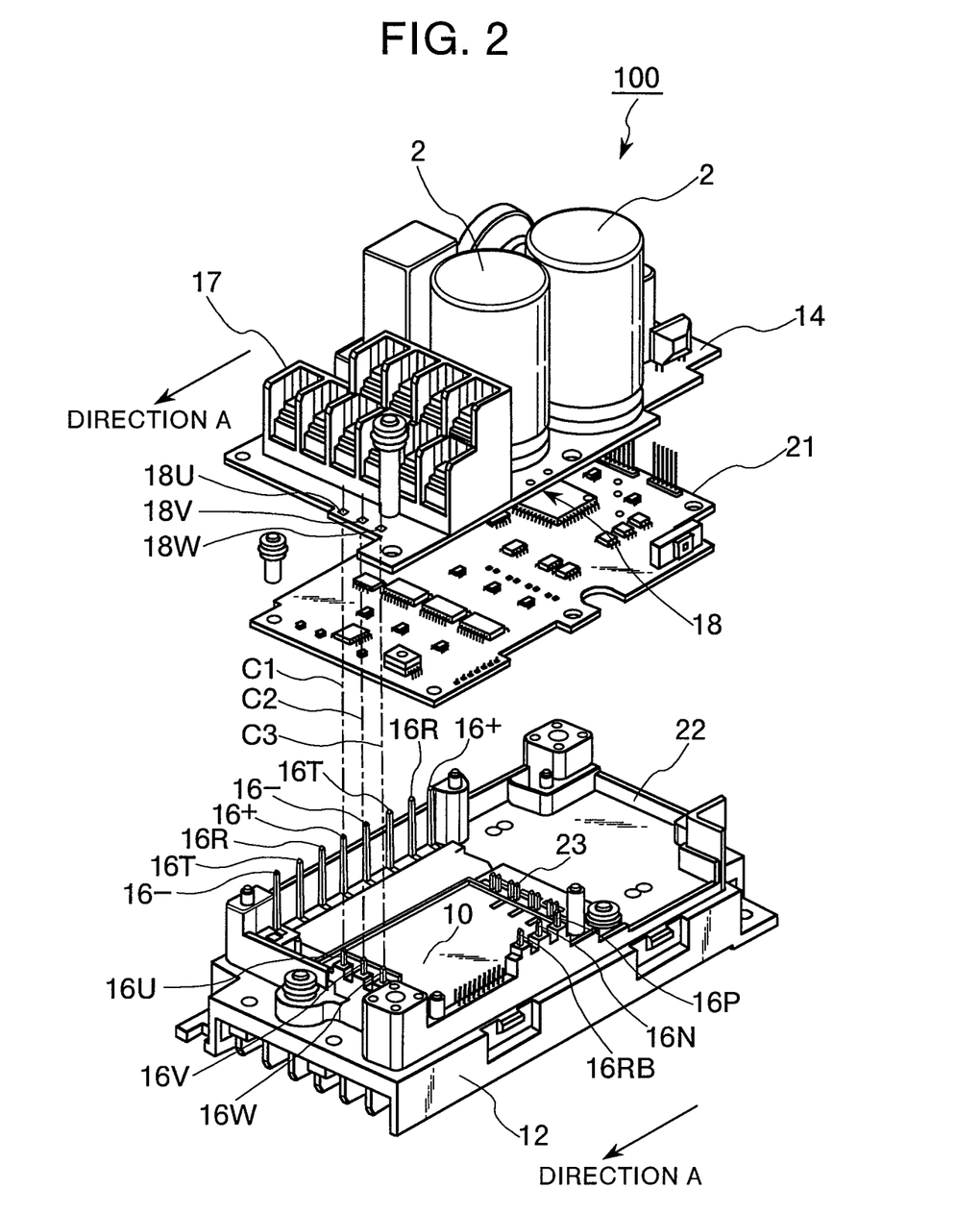
FIG. 2 is a diagram showing an example of an arrangement of main elements of the power transducer.
Figure 3:
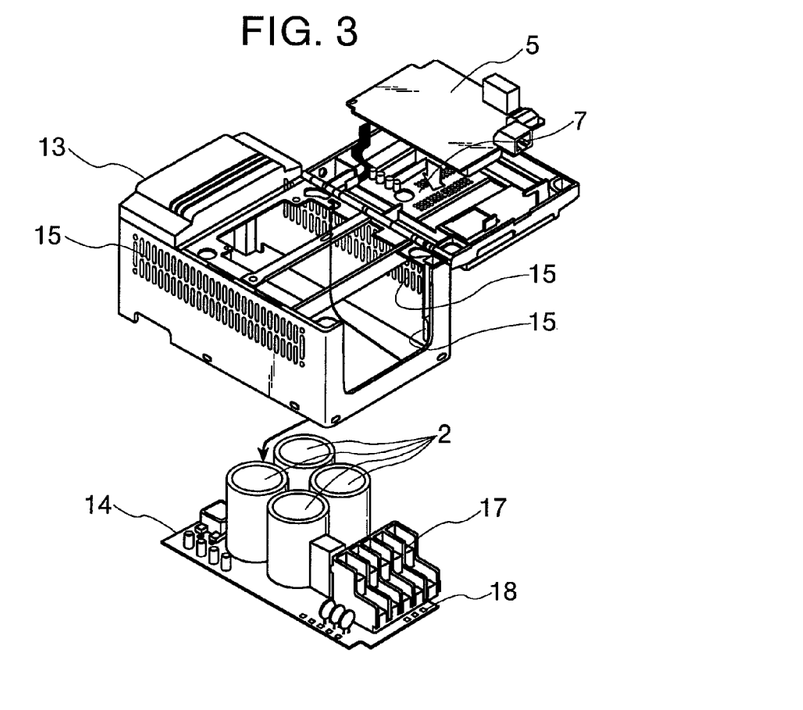
FIG. 3 is a bird's-eye view showing the state in which a power semiconductor module is mounted on a main circuit board.

FIGS. 2 and 3 are diagrams each showing the state in which main parts of the power transducer are assembled. In FIG. 2, the power semiconductor module 10 includes the inverter 3 and a peripheral circuit of the inverter 3. The power transducer further includes a module case 22 provided for the power semiconductor module 10. The inverter 3 is composed of an IGBT that is a power semiconductor element. The inverter 3 is mounted on an insulating substrate (included in the power semiconductor module 10) as a chip. The power semiconductor module 10 has, on the insulating substrate, control elements such as a current detection resistor and a temperature protective thermistor. The power semiconductor module 10 is configured to ensure that the internal elements of the power semiconductor module 10 are sealed by means of a filling material in order to insulate and protect the internal elements. In the present embodiment, the inverter 3 and the peripheral circuit are included in the power semiconductor module 10. The present invention is not limited to this configuration.

The present invention can be applied to the case where the converter 1 and the inverter 3 are not included in the power semiconductor module 10 and are provided as discrete elements of the power semiconductor module 10.

As shown in FIG. 2, the power transducer 100 includes the cooling fan 6 and a cooling fin 12. The cooling fan 6 and the cooling fin 12 are adapted to cool the power semiconductor module 10. As shown in FIG. 3, the power transducer 100 further includes a resin mold case 13 and a main circuit board 14. The cooling fan 6 and the cooling fin 12 join together to ensure that the resin mold case 13 covers the main circuit board 14 and the like. Heat generated by the power semiconductor module 10 that is a heat-generating component is transferred to the cooling fin 12. The cooling fan 6 feeds air (cooling air) to the cooling fin 12 for heat exchange. Due to the heat exchange, the heat generated by the power semiconductor module 10 is released from the power semiconductor module 10. The smoothing capacitor 2, a main circuit terminal stage 17 and the like are mounted on the main circuit board 14.

Referring to FIG. 2, plural groups of lead terminals 16 extend from the power semiconductor module 10. Reference numeral 17 is a main circuit terminal stage. The lead terminals 16 extending from the case provided for the power semiconductor module 10 are electrically connected with the main circuit terminal stage 17 through a copper foil pattern formed on the main circuit board 14. The lead terminals 16U, 16V, 16W extend through through-holes 18U, 18V, 18W formed in the main circuit board 14 as shown by through-hole lines C1 to C3; in this case the lead terminals 16U, 16V, 16W are connected with the main circuit terminal stage 17 by means of solder. After all parts are mounted on the main circuit board 14, the main circuit board 14 is coated with varnish to improve an insulation property of the main circuit board 14.

The power semiconductor module 10 is mounted on the cooling fin 12 to be cooled. The main circuit board 14 covers the power semiconductor module 10. After the lead terminals 16 extending from the module case 22 provided for the power semiconductor module 10 are connected to the main circuit board 14, the lead terminals 16 are electrically connected to the main circuit terminal stage 17 through the copper foil pattern formed on the main circuit board 14.

The main circuit terminal stage 17 is provided on the upstream side of the cooling air used to cool the power semiconductor module 10 (on the lower side in a state in which the power transducer 100 is installed in a control panel attached on a wall surface) such that a user of the power transducer 100 can easily set an input wiring and an output wiring. In FIGS. 2 and 3, the power transducer is in a lying state. When the user actually uses the power transducer, the power transducer is placed in a standing state such that the resin mold case 13 faces the side of the user, i.e., the digital operation panel 7 faces the side of the user. Specifically, the power transducer 100 is installed in such a manner that the direction shown by arrow A is a lower side for practical use.

The main circuit terminal stage 17 is electrically connected with the copper foil pattern formed on the main circuit board 14 (that is a large-current circuit board). A current of several tens of amperes may flow in the copper foil pattern. It is, therefore, necessary that the copper foil pattern have a width and thickness required to resist the current. When a ratio of the area of the copper foil pattern to the area of the main circuit board 14 is large, another element cannot be mounted in the power transducer. In this case, the copper foil pattern may restrict a reduction in the size of the power transducer.

Figure 7A:
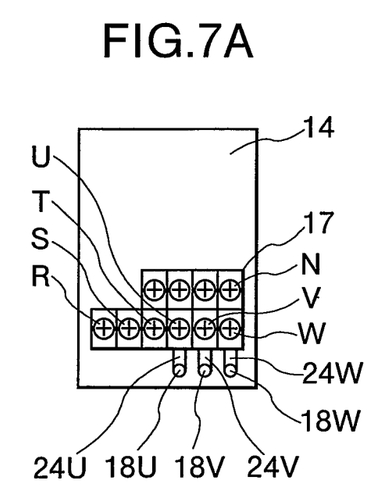
FIGS. 7A and 7B are diagrams showing a copper foil pattern provided on the main circuit board according to the embodiment of the present invention.
Figure 7B:
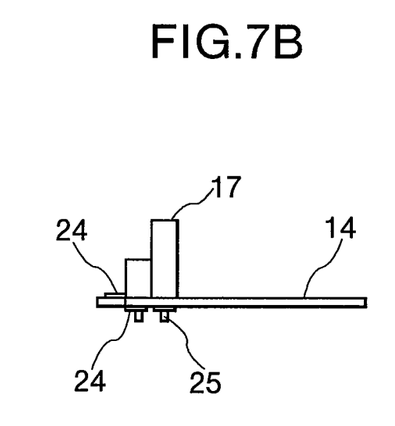

FIGS. 7A and 7B illustrate copper foil patterns provided in the main circuit board 14. A copper foil pattern section 24 includes patterns 24U, 24V, 24W. As shown in FIG. 7B, a lead end 25 is connected at a rear side of the main circuit board 14 by soldering.

Terminals R, S, T, U, V, W for the main circuit terminal stage 17 each denote a terminal name used for the user of the power transducer 100 to make input and output wiring. The copper foil pattern 24U is electrically connected with the terminal name U of the stage 17. The copper foils 24V and 24W are electrically connected with the terminal names V and W, respectively.

Figure 6:
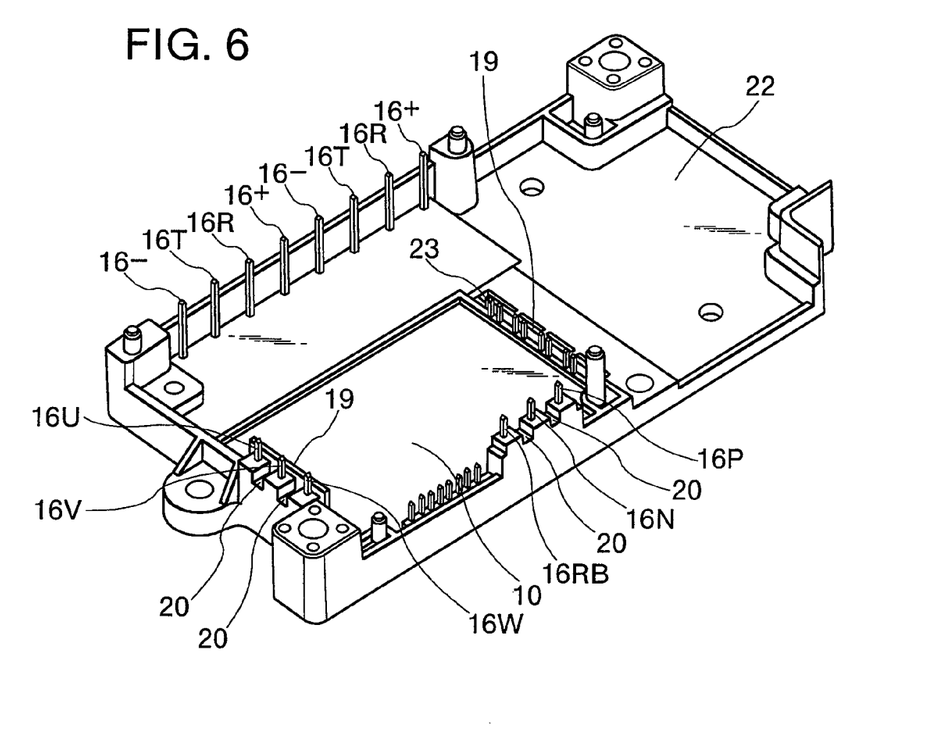
FIG. 6 is a diagram showing details of the power semiconductor module according to the embodiment of the present invention.

The through-hole 18U in the main circuit board 14 is electrically connected with the terminal 16U of the terminals 16 extending from the case of the power semiconductor module 10 shown in FIG. 6 by solder. The through-holes 18V and 18W are electrically connected with the terminals 16V and 16W, respectively, by solder.

Since a current as large as several tens A flows in the copper foil patterns 24U, 24V, 24W, it is necessary to design such that the copper foil is made shorter. The copper foil pattern needs to have a thickness and width enough to endure current and a distance for insulation between the respective copper foils. Also, to reduce loss in the copper foil, the length of the copper foil pattern is important for reduction in the size of the device.

The main circuit terminal stage 17 is provided on the upstream side of the cooling air used to cool the power semiconductor module 10 (on the lower side in a state in which the power transducer 100 is installed in a control panel attached on a wall surface) such that a user of the power transducer 100 can easily set an input wiring and an output wiring. Thus, it is effective for reduction in loss occurring on the copper foil pattern and reduction in the size of the power transducer to provide the through-holes 18 in the main circuit board 14 in the vicinity of the main circuit terminal stage 17.

High potentials are applied to the lead terminals 16R, 16S, 16T, 16−, 16+, 16U, 16V, 16W, 16P, 16N and 16RB (shown in FIG. 2) extending from the case 22 provided for the power semiconductor module 10. Thus, a high potential is applied to a region between portions of the copper foil pattern connected with the lead terminal section 16. Thus, it is necessary that a distance (insulation distance) between the portions of the copper foil pattern, which is required to insulate a region between the portions of the copper foil pattern and complies with a standard, be maintained. A component that causes a different potential cannot be mounted between portions of the copper foil pattern since the insulation distance needs to be maintained. This may prevent the power transducer from being downsized.

According to the above description, it is preferable that the length of the copper foil pattern connecting the lead terminal section 16 of the power semiconductor module 10 with the main circuit terminal stage 17 be as short as possible in order to reduce the size of the main circuit board 14 and thereby reduce the size of the power transducer. As described above, the main circuit terminal stage 17 is located on a lower side of the power transducer in consideration of convenience for the user of the power transducer.

In the present embodiment, as shown in FIG. 2, the lead terminals 16U, 16V and 16W extending from the power semiconductor module 10 are connected to the main circuit board 14 in the vicinity of the main circuit terminal stage 17. Specifically, the through-holes 18U, 18V, 18W are provided for connection to the lead terminals at a space defined between the distal end of the main circuit terminal stage 17 disposed at the lower side of the circuit board 14 and the distal end of the main circuit board 14 and defined in the vicinity of the stage 17. This configuration makes it possible to reduce the lengths of portions (of the copper foil pattern) extending from the main circuit terminal stage 17 to points at which the lead terminals are connected with the main circuit board 14. Thus, the main circuit board 14 can be downsized.

For the provision of the through-holes in the vicinity of the stage 17, it is desirable to provide the through-holes at a position distant by about 3-10 mm from the distal end of the main circuit terminal stage 17. If the distance is 3 mm or less, it is necessary to provide a through-hole diameter suitable for each diameter of lead the terminals of the power semiconductor module 10. In this case, each of the through-holes contact the distal end of the stage 17 and thereby solder fillet is not sufficiently assured, which may result in remarkable reduction of soldering strength.

If the distance is 10 mm or more, insulation distance in conformity with the standards needs to be assured between the copper foil patters (between the copper foil pattern 24U and 24V, and between the copper foil patterns 24v and 24W). The size of the main circuit board 14 is inevitably increased and the main circuit board 14 runs off the power semiconductor module 10. According the size of the power semiconductor module is increased, with the result that attempt to downsize the device may be greatly restricted.

That is, the vicinity of the main circuit terminal stage 17 means such distances that each of the lead terminals of the power semiconductor module 10 can be connected with each of the copper foil patterns 24U, 24V, 24W; the lead terminals 16U, 16V 16W can be extended through; and each end of the through-holes 18U, 18V, 18W does not contact the distal end of the stage 17 and the end of the main circuit board 14. It is better that a distance between the stage 17 and peripheral parts of the through-holes 18U, 18V, 18W at a side of the stage 17 is made small as much as possible. It is better that a distance from the end at a side of input and output wiring of the stage 17 to the end of the circuit board 14 close to the former end is made short as much as possible.

In this way, the through-holes 18U, 18V, 18W are formed in proximity with the main circuit terminal stage 17 between the distal end of the main circuit board 14 and the stage 17 provided at a side of the lower end of the circuit board 14, whereby solder fillet is sufficiently assured and decrease in soldering strength can be reduced. Further, the wiring pattern can be made shorter ranging from a location at which the lead terminals 16U, 16V, 16W are connected with the circuit board 14 to a location at which the lead terminals 16U, 16V, 16W are connected with the stage 17. Thus, loss occurring on the copper foil patterns can be reduced and down-sizing of the circuit board 14 is possible.

Further, insulation distance in conformity with the standards can be assured between the copper foil patterns (between the copper foil patterns 24U and 24V, and between the copper foil patterns 24V and 24W). As a result, the size of the main circuit board 14 is reduced, so that the circuit board 14 is prevented from running off the power semiconductor module 10, which prevents the power semiconductor module 10 from becoming large and leads to the miniaturization of the power transducer.

Figure 4A:
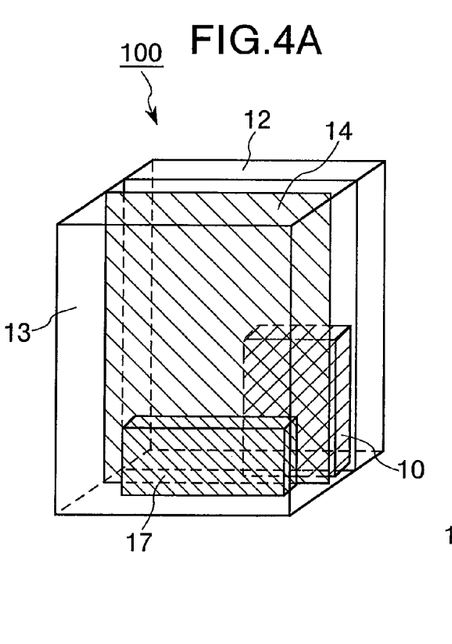
FIGS. 4A and 4B are diagrams showing an arrangement of elements of the power transducer that is in a used state.
Figure 4B:
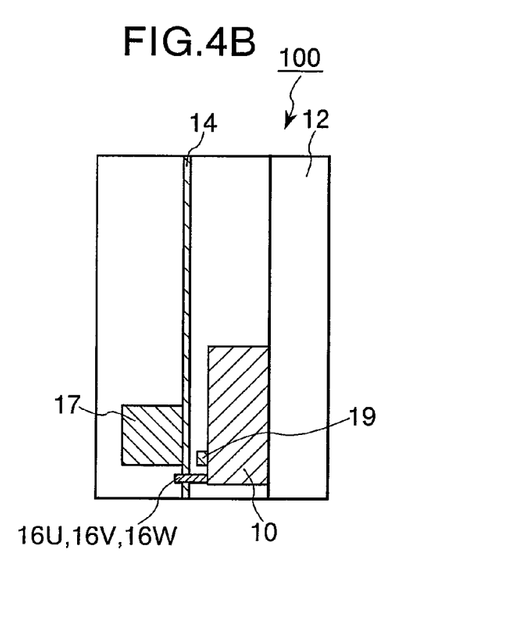

FIGS. 4A and 4B each show a positional relationship among the main circuit board 14, the cooling fin 12, the power semiconductor module 10 and the like of the power transducer that is in a standing state. FIG. 4B is a conceptual cross sectional view of the power transducer in the standing state when viewed from the side of the power transducer.

As described above, according the first embodiment, the main circuit terminal stage 17 is provided at the lower side of the power transducer 100 in consideration user's convenience. In the first embodiment, although the terminals 16U, 16V, 16W are connected at the lower side than the circuit terminal stage 17, the present invention is limited to the embodiment. Alternatively, the through-holes 18U, 18V, 18W are provided at a side above the stage 17 for connection to the lead terminals 16U, 16V, 16W.

Figure 8:
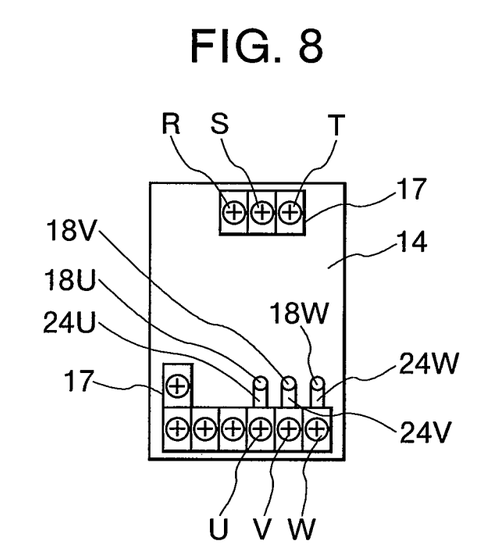
FIG. 8 is a diagram showing a copper foil pattern provided on the main circuit board according to another embodiment of the present invention.

FIG. 8 is another embodiment in which the main circuit terminal stage 17 is divided on the main circuit board 14 and the lead terminals 16U, 16V, 16W are connected at a side above the stage 17. Other lead terminal are applied with high voltages. In terms of the width of the copper foil pattern and the insulation distance, the same effect is obtained.

When the converter or the inverter is provided as a discrete element of the power semiconductor module and composed of a power semiconductor, the power semiconductor is connected to the main circuit board 14 in the vicinity of the main circuit terminal stage 17. In this case, the lengths of the portions of the copper foil pattern can be reduced in a similar manner to the above description, and the power transducer can be downsized (since the power semiconductor module can be downsized).

Second Embodiment

A power transducer according to the second embodiment of the present invention is described with the drawings. The power transducer according to the second embodiment is configured on the basis of the power transducer according to the first embodiment. In the power transducer according to the second embodiment, predetermined lead terminals included in the power semiconductor module 10 are connected with the main circuit board 14 at positions lower than the main circuit terminal stage 17 as shown in FIG. 2 (on the lower side in a state in which the power transducer 100 is installed in a control panel attached on a wall surface).

In this case, the main circuit board 14 and the power transducer can be downsized as described above. The present embodiment describes the case where power semiconductors are included in the power semiconductor module 10. The present embodiment, however, can be applied to the case where the power semiconductors are provided as discrete elements of the power semiconductor module 10.

The following describes a cooling structure of the power transducer according to the present embodiment. The power semiconductor module 10 is configured as a composite module. The power semiconductor module 10 has a temperature detector (not shown) therein. The temperature detector detects the temperature of the inside of the power semiconductor module 10. As shown in FIGS. 4A and 4B, the power semiconductor module 10 is located between the cooling fin 12 and the main circuit board 14 to be cooled. The power semiconductor module 10 is surrounded by a cover 13 attached to the cooling fin 12. Openings 15 for ventilation having a plurality of apertures are provided on an upper surface (not shown), two side surfaces and a lower surface of the cover 13 as shown in FIG. 3.

The heat generated by the power semiconductor module 10 that is a heat-generating component is transferred to the cooling fin 12. The cooling fan 6 is adapted to forcibly cool, with air, the cooling fin 12 that receives the heat from the power semiconductor module 10. The cooling fan 6 is not adapted to forcibly cool, with air, the inside of the power transducer surrounded by the cover 13 attached to the cooling fin 12. The cooling fan 6 sucks cool air present around the power transducer mainly through the openings (for ventilation) provided on the side surfaces and lower surface of the cover 13 and releases warm air from the power transducer through the openings provided on the upper surface of the cover 13.

In the method for cooling the inside of the power transducer, natural convection circulation is formed due to a difference between the temperature of air present in the power transducer and the temperature of air present outside the power transducer. Thus, lint present in the air present outside the power transducer is sucked into the power transducer due to the natural convection circulation. The power transducer 100 is installed in such a manner that the direction shown by arrow A is a lower side for practical use.

In the present embodiment (that allows the power transducer to be downsized), the lead terminals (16U, 16V and 16W in the present embodiment) extending from the case 22 for the power semiconductor module 10 are located on the upstream side of the air used to cool the power transducer (on the lower side in a state in which the power transducer 100 is installed in a control panel attached on a wall surface) as shown in FIGS. 4A and 4B.

Figure 5:
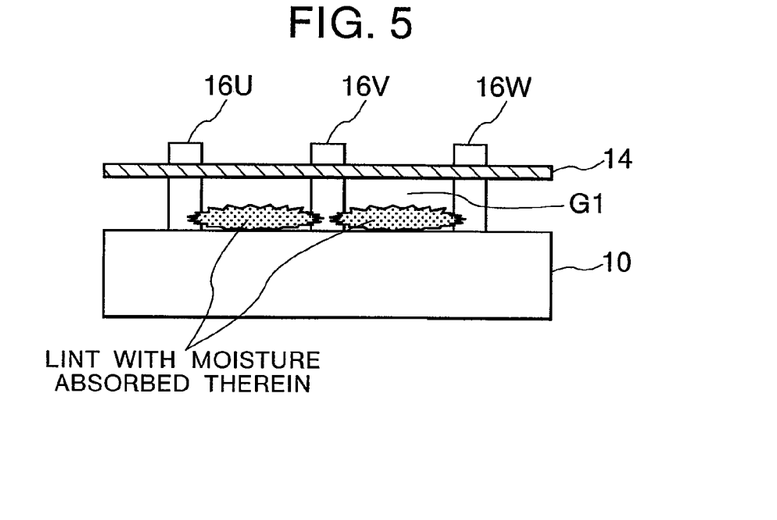
FIG. 5 is a diagram showing the state in which lint is accumulated between lead terminals according to an embodiment of the present invention.

FIG. 5 is a diagram showing the state in which the lead terminals extending from the power semiconductor module 10 are connected with the main circuit board 14 when viewed from the below. As shown in FIG. 5, lint may be accumulated in spaces defined by the main circuit board 14 and the lead terminals that are adjacent to each other and extend from the case provided for the power semiconductor module 10. Due to absorption of moisture by the lint, the adjacent lead terminals may be short-circuited.

In an environment in which a textile machine is placed, lint may hover in air. In some cases, the textile machine operates in an environment humidified in order to prevent textile thread from being cut. When the power transducer is used in such an environment, lint may be accumulated between adjacent lead terminals of the power semiconductor module 10 included in the power transducer. Due to absorption of moisture by the lint, the adjacent lead terminals may be short-circuited. As a result, the power transducer may not normally operate.

It is impossible to completely protect equipment (such as the machine described above) from lint or the like. Thus, when such a problem as described above occurs, it is necessary to stop the equipment for a period of time to specify the cause of the problem and maintain the equipment. This may significantly affect productivity of the equipment. It is therefore desirable to provide a power transducer that is highly reliable in such an environment and can be easily used.

The smoothing capacitor 2 and other electronic components are mounted on the main circuit board 14 as shown in FIG. 2. High potentials are applied to the lead terminals 16R, 16S, 16T, 16−, 16+, 16U, 16V, 16W, 16P, 16N, 16RB of the lead terminal section 16, respectively. The lead terminals 16R, 16S, 16T, 16U, 16V, 16W, 16P, 16N, 16RB are arranged to ensure that an insulation distance between the each pair of adjacent lead terminals is maintained.

The lead terminals 16R, 16S, 16T, 16−, 16+, 16U, 16V, 16W, 16P, 16N, 16RB extend from the module case 22 through the through-holes 18 (formed in the main circuit board 14) and are soldered to the main circuit board 14. After the soldering, the lead terminals extending from the main circuit board 14 may be coated with varnish to enhance insulation. The lead terminal section located in a space between the power semiconductor module 10 and the main circuit board 14 cannot be coated with varnish. When the power transducer is installed in a humid environment (such as an environment in which a textile machine is placed) in which there is lint, the lint is accumulated between the adjacent lead terminals extending from the module case 22 as shown in FIG. 5. Due to absorption of moisture by the lint, the adjacent lead terminals may be short-circuited and the power transducer may be broken.

In general, the power transducer has a wall hanging structure and is vertically attached to an iron plate such as a panel. Thus, a space in which the power transducer is installed is restricted. It is requested that the power transducer be as small as possible. In the present embodiment, since the lead terminals 16U, 16V and 16W extending from the power semiconductor module 10 are connected with the main circuit board 14 in the vicinity of the main circuit terminal stage 17, the power semiconductor module 10 is arranged to ensure that the lengths of wire lines of the copper foil pattern are as short as possible.

The main circuit terminal stage 17 is located on the lower side (on the lower side in a state in which the power transducer 100 is installed in a control panel attached on a wall surface) of the power transducer hung on a wall in order to ease a connection of a power line to the main circuit terminal stage 17 after installation of the power transducer. Thus, the power transducer can be downsized. However, lint may be easily accumulated between the lead terminals 16U and 16V and between the lead terminals 16V and 16W when the power transducer is installed in a humid environment in which there is lint.

FIG. 5 shows the state in which lint is accumulated between the lead terminals 16U and 16V and between the lead terminals 16V and 16W. Lint with moisture absorbed therein falls into and is accumulated in a space G1 between the adjacent lead terminals 16V and 16W located on the lower side (on the lower side in a state in which the power transducer 100 is installed in a control panel attached on a wall surface) of the power transducer. Due to the lint, a layer short may occur in a space defined by the insulation distance, and the adjacent lead terminals may be short-circuited.

As shown in FIG. 3, the main elements are arranged in the power transducer and covered by the cover 13. The power semiconductor module 10 is mounted on the cooling fin 12, and the main circuit board 14 is attached to the power semiconductor module 10, as shown in FIG. 3. The resin mold case 13, which is an insulating material, is fitted with the power semiconductor module 10 from an upper side.

The size of a case for the inverter depends on the size of the power semiconductor module 10 when the power transducer is small in many cases. The lead terminals 16R, 16S, 16T, 16−, 16+, 16U, 16V, 16W, 16P, 16N and 16RB of the lead terminal section 16 included in the power semiconductor module 10 are electrically connected with the main circuit terminal stage 17 via the copper foil pattern formed on the main circuit board 14. In the present embodiment, the power semiconductor module 10 is arranged to ensure that the lengths of the wire lines of the copper foil pattern formed on the main circuit board 14 from the predetermined lead terminals (16U, 16V, 16W) to the main circuit terminal stage 17 are as short as possible for reduction in the size of the power transducer, as described above.

The lead terminal section 16 of the power semiconductor module 10 is located in the vicinity of the resin mold case 13. A distance between the lead terminal section 16 and the resin mold case 13 is small. This configuration causes lint with moisture absorbed therein to be accumulated between the lead terminals of the lead terminal section 16 in the case where the power transducer is installed in a humid environment in which there is lint.

The present invention devised to solve the aforementioned problem is described below.

FIG. 6 is a diagram showing the power semiconductor module 10 according to the present invention in detail.

The power semiconductor module 10 according to the present invention has a partition wall 19 on the upper side of the lead terminals 16U, 16V, 16W that are arranged in the vicinity of the main circuit terminal stage 17 and extend from the power semiconductor module 10. Since the partition wall 19 covers the lead terminals from the upper side, lint with moisture absorbed therein or the like is accumulated on the partition wall 19 arranged on the upper side (on the upper side in a state in which the power transducer 100 is installed in a control panel attached on a wall surface, referred to as upper side) of the lead terminals even under the condition that the power transducer is hung on a wall. This configuration of the power transducer prevents the adjacent lead terminals 16U and 16V from being short-circuited. Also, the configuration of the power transducer prevents the adjacent lead terminals 16V and 16W from being short-circuited. Thus, this configuration prevents the power transducer from being broken due to the lint or the like.

FIG. 4B conceptually illustrates the positional relationship between the partition wall 19 and the lead terminals 16U, 16V and 16W. As described above, the partition wall 19 is located on the upper side of the lead terminals such that they are covered when the power transducer 100 is used. The partition wall 19 is located so as not to be in contact with the lead terminals 16U, 16V and 16W.

Figure 9A:
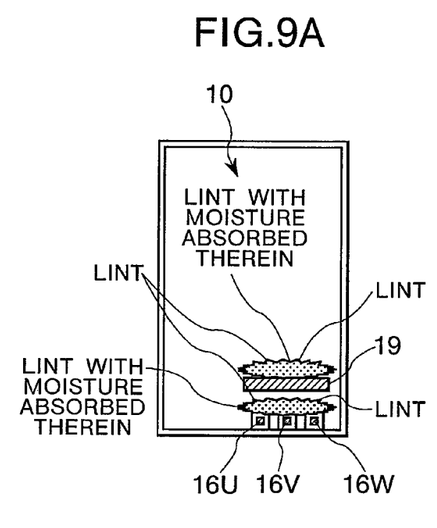
FIGS. 9A and 9B are diagrams showing the state in which dust such as lint is accumulated between lead terminals and a partition wall.

As shown in FIG. 9A, if a spatial distance between the partition wall 19 and the lead terminals 16U, 16V and 16W is great, then dust such as lint with moisture absorbed therein stays between the exposed, adjacent lead terminals 16U, 16V, 16W and the partition wall 19 thereabove. As a result, due to short-circuiting which will occur between the lead terminals 16U and 16V or between the lead terminals 16V and 16W, the power transducer 100 may not be prevented from breakage.

Figure 9B:
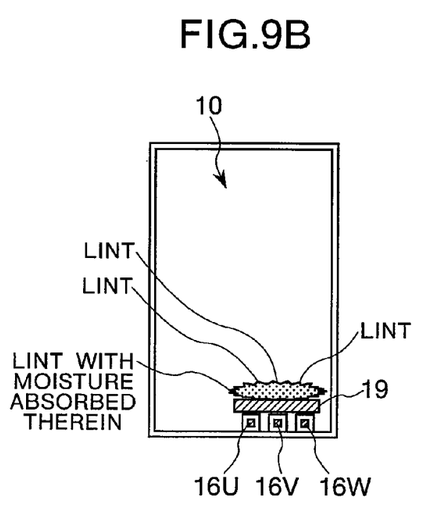

To avoid such breakage, the partition wall 19 is provided in such a position that it does not contact the lead terminals 16U, 16V, 16W as shown in FIG. 9B.

The lead terminals of the lead terminals section 16 are connected with the main circuit board 14 by means of solder via the through-holes 18 formed in the main circuit board 14. Thus, the heights of the lead terminals 16U, 16V and 16W are less than the height of the partition wall 19.

Thus, if the partition wall 19 is provided at a position where it is in contact with the lead terminals 16U, 16V and 16W, then dust such as lint with moisture absorbed therein stays on the partition wall 19 and so the partition wall 19 will not function. As a result, short-circuit occurs between the lead terminals 16U and 16V or between the lead terminals 16V and 16W, the power transducer 100 may not be prevented from breakage.

As shown in FIG. 6, a recessed portion 20 may be provided between the adjacent lead terminals extending from the case 22 provided for the power semiconductor module 10. Lint can pass through the recessed portion 20. This configuration reduces the amount of lint accumulated on the lead terminals.

The present embodiment describes the power semiconductor module 10 including the partition wall 19 that is arranged in the vicinity of the lead terminals connected with the main circuit board 14 on the lower side of the power transducer under the condition that the power transducer is hung on a wall. The same effect as described above can be expected when partition walls 19 are arranged in the vicinities of all the lead terminals.

Lint may be easily accumulated on the lead terminals (for example, the lead terminals 16U, 16V, 16W in FIG. 6) that are horizontally arranged on the lower side of the power transducer and are connected with the main circuit board 14. Thus, the effect of the partition wall according to the present embodiment is significant. However, lint may be accumulated on the lead terminals vertically arranged, and the lead terminals may be short-circuited. In addition, when lead terminals other than the lead terminals (for example, the lead terminals 16R, 16S, 16T, 16−, 16+, 16P, 16N, 16RB in FIG. 6) arranged on the lower side of the power transducer are horizontally arranged, lint may be accumulated on the lead terminals.

The present invention is not limited to the configuration in which the power semiconductor module is connected with the main circuit board on the lower side of the power transducer according to the first embodiment. When the lead terminals are horizontally or vertically arranged and the partition wall covers the space between the power semiconductor module and the main circuit board, this configuration can prevent the lead terminals from being short-circuited. When the lead terminals are vertically arranged, the partition walls 19 need to be provided between respective groups of lead terminals.

According to the present embodiment, the partition wall is provided on the upper side of the lead terminals extending from the power semiconductor module to the main circuit board to prevent lint from being accumulated on the lead terminals. Thus, the adjacent lead terminals are not short-circuited and the power transducer is not broken even in a humid environment in which there is lint discharged from a textile machine or the like. Therefore, the power transducer is highly reliable.

While we have shown and described several embodiments in accordance with out invention, it should be understood that disclosed embodiments are susceptible of changes and modifications without departing from the scope of the invention. Therefore, we do not intend to be bound by the details shown and described herein but intend to cover all such changes and modifications as fall within the ambit of the appended claims.

What is claimed is:

1. A power transducer comprising:
   a power semiconductor module;
   a main circuit board disposed adjacent to the power semiconductor module;
   lead terminals which are electrically connected with the main circuit board and the power semiconductor module which extend from the power semiconductor module;
   a partition wall disposed to extend from the power semiconductor module in a same direction as said lead terminals;
   wherein the partition wall extends above at least a portion of the lead terminals; and
   a main circuit terminal stage disposed to the main circuit board;
   wherein the lead terminals extend through the main circuit board and are connected to the main circuit board in the vicinity of the main circuit terminal stage, and
   wherein the lead terminals extend through the main circuit board and are connected to the main circuit board below the main circuit terminal stage.

2. The power transducer according to claim 1, wherein the partition wall is disposed between the power semiconductor module and the main circuit board.

3. The power transducer according to claim 1, wherein the partition wall covers the lead terminals from above.

4. The power transducer according to claim 1,
   wherein the partition wall is disposed between a first edge and a second edge;
   wherein the first edge is an edge at a side for input and output of wiring in the main circuit terminal stage and the second edge is an edge opposite to a side of the first edge.

5. The power transducer according to claim 1, wherein the lead terminals are plural and the lead terminals are covered by the partition wall.

6. The power transducer according to claim 1, wherein the lead terminals and the partition wall extend in the same horizontal direction.

7. The power transducer according to claim 1, wherein the lead terminals are plural and a recessed portion is provided between the adjacent lead terminals.

8. The power transducer according to claim 1, wherein a distance the partition wall extends from the power semiconductor module is less than a distance the lead terminals extend from the power semiconductor module in the same direction.

* * * * *